United States Patent [19]

Vance et al.

[11] Patent Number: 4,618,967
[45] Date of Patent: Oct. 21, 1986

[54] RADIO RECEIVER

[75] Inventors: Ian A. W. Vance, Newport; Michael W. Neale, Harlow, both of England

[73] Assignee: Standard Telephones and Cables, plc, London, England

[21] Appl. No.: 624,749

[22] Filed: Jun. 26, 1984

[30] Foreign Application Priority Data

Jul. 14, 1983 [GB] United Kingdom ................ 8319101

[51] Int. Cl.⁴ ........................ H04B 1/16; H04L 27/14
[52] U.S. Cl. ........................................ 375/80; 375/88; 455/214; 329/126
[58] Field of Search ...................... 375/80, 38, 39, 102, 375/75, 45, 88, 82, 86; 455/205, 214; 329/126, 110, 122, 124, 50

[56] References Cited

U.S. PATENT DOCUMENTS 3,421,089  1/1969  Lyghounis ............................ 375/88
3,748,590  7/1973  Gray ................................... 329/122

OTHER PUBLICATIONS

Belleson; IBM Technical Disclosure Bulletin; "Wideband Frequency Demodulator;" vol. 9; No. 10; Mar. 1967; pp. 1464–1466.

Primary Examiner—Marc E. Bookbinder
Assistant Examiner—Andrew J. Telese, Jr.
Attorney, Agent, or Firm—Dennis P. Clarke

[57] ABSTRACT

A radio receiver for frequency modulated signals in which direct conversion techniques are used to provide zero I.F. quadrature baseband signals I & Q. The I & Q signals are limited (11,12) to form square wave signals and pulse forming networks (13,14) derive pulse sequences the frequencies of which represent the polarity changes in the square wave signals. Each square wave is multiplied (15,16) by the pulse sequence derived from the other square wave to produce a unipolar pulse train. The two unipolar pulse trains are combined (17) to give a digital output signal the frequency of which is equal to the sum of the frequencies of the two pulse trains. Low pass filtering the output signal produces a simulation of the original baseband modulation.

6 Claims, 7 Drawing Figures

RADIO RECEIVER

This invention relates to a radio receiver for frequency modulated signals on an R.F. carrier.

British patent specification No. 1517121 describes a so-called "direct conversion" radio receiver in which the incoming R.F. signals are mixed with a local oscillator signal at the carrier frequency to produce quadrature baseband signals. In the case of FSK binary signals the resultant quadrature baseband signals are, after limiting, identical square wave constant frequency signals which have ±90° phase difference depending on the binary value being transmitted. The quadrature baseband signals can be simply processed, as disclosed in patent specification No. 1517121 to provide a digital output in the case where the initial modulation is conveying binary encoded digital information, or they can be processed in a more complex manner to provide a simulated analogue output representative of analogue information modulated on the R.F. carrier signal, as disclosed in British patent application No. 8128956.

One of the advantages of direct conversion radio receivers is that they are suited for construction in integrated circuit form. This invention provides a demodulation arrangement for a direct conversion radio receiver that is advantageous for integrated circuit implementation.

According to the invention there is provided a radio receiver for receiving frequency modulated signals on an R.F. carrier signal, wherein the received signals are mixed with a local oscillator signal at the carrier signal frequency to produce quadrature baseband signals in two separate signal channels, the receiver including a demodulator arrangement for the baseband signals, the demodulator arrangement including means for limiting the baseband signals in each signal channel to form square wave signals in quadrature, means in each channel to derive from the square wave signals in that channel a sequence of pulses the frequency of which is representative of the polarity changes in the square wave signal, means for multiplying the pulse sequence in each channel by the square wave signal in the other channel to produce two unipolar pulse trains, the pulse frequency in each unipolar pulse train being equal to that of the pulse sequence from which it is derived, and means for generating an output pulse signal the frequency of which is equal to the sum of the frequencies of the two unipolar pulse trains such that when the output pulse signal is low pass filtered it simulates information modulated on the R.F. signal.

Embodiments of the invention will now be described with reference to the accompanying drawings, in which.

Figure 1:
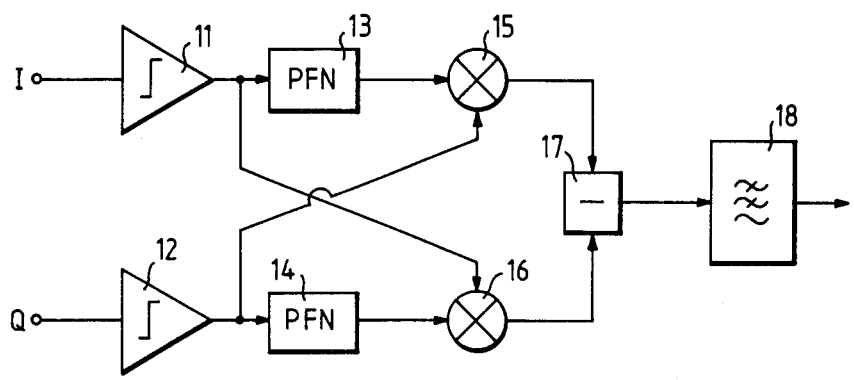
FIG. 1 is a block diagram of a radio receiver according to a general embodiment of the invention.
Figure 2:
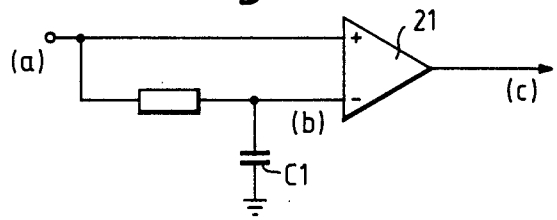
FIG. 2 is a block circuit diagram of a pulse forming network which may be used in the embodiment of FIG. 1.
Figure 3:
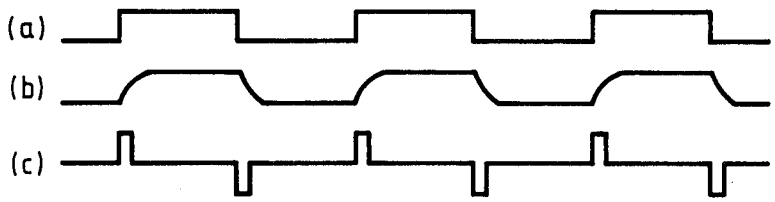
FIG. 3 shows waveforms applicable to the circuit of FIG. 2.
Figure 4:
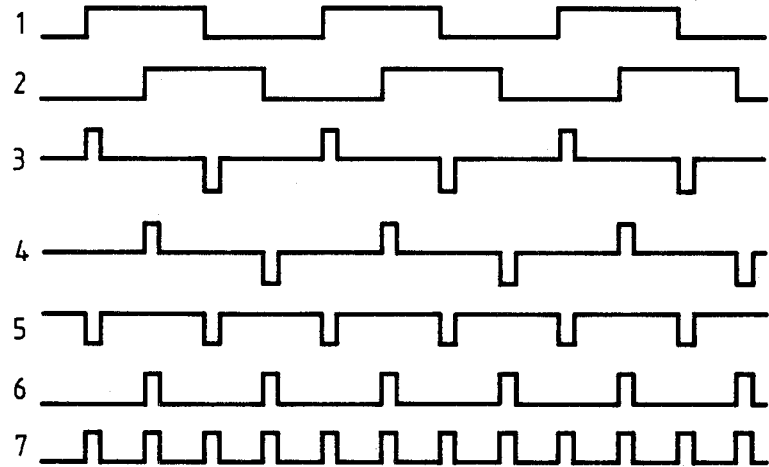
FIG. 4 shows waveforms applicable to the block circuit diagram of FIG. 1.

In the arrangement shown in FIG. 1 the I and Q baseband signals in quadrature from the R.F. front end (not shown) of the direct conversion receiver are applied to limiting amplifiers 11,12, the outputs of which are square waves as shown in FIG. 4 at 1 and 2 (in this example in the condition that there is a single tone input signal beating with the local oscillator signal). The square waves are each fed to a respective pulse forming network 13,14 the function of which is to derive from the square waves pulse sequences the frequency of which is representative of the polarity changes in the square wave signals. FIG. 4 shows the resultant pulse sequences 3 and 4. In this example the pulse sequences are of alternating polarity mirroring the changes in the square wave signal. The pulse forming networks could be simple CR differentiators. FIG. 2 shows an alternative pulse forming network in which the square wave signal is applied to one input of a differential amplifier 21, and via an integrating RC network to the other input of the amplifier. The relevant waveforms are shown in FIG. 3, the square wave (a) being one input, the integrated waveform (b) being the other input and the pulse sequence (c) being the amplifier output. The arrangement of FIG. 2 is attractive for implementation in an integrated circuit since the capacitor C1 is in shunt to ground and thus needs only one pin if external to the chip.

Returning now to FIG. 1 the pulse sequences 3 and 4 are each multiplied in multipliers 15,16 by the square wave from the other channel, i.e. pulse sequence 3 of FIG. 4 is multiplied by square wave 2 and sequence 4 by square wave 1. Taking the square waves 1 and 2 in the sense that they are representing plus and minus binary values it is clear that they serve to invert alternate pulses in the multiplied pulse sequences to give the unipolar pulse trains 5 and 6, with pulse train 5 being of the opposite polarity to pulse train 6. Pulse trains 5 and 6 are subtracted in network 17, resulting in an output pulse signal 7 the frequency of which is equal to the sum of the frequencies of the two unipolar pulse trains. This output pulse signal has pulses of one polarity only, one pulse for each edge of either square wave 1,2. If these output pulses are conventionally assigned for the condition shown as positive pulses, then for the alternative quadrature condition derived from the input signal beating from the opposite side of the local oscillator frequency the pulses would have a negative polarity. When filtered by a low pass filter 18 the output pulses are smoothed to give approximately a d.c. level the magnitude of which depends on the pulse frequency which in turn depends on the frequency of the beat note. This smoothed output is therefore the demodulated frequency difference information as required for detecting frequency modulation. Note that although the example described relates primarily to a two tone frequency shift keyed information signal, such as is used in wide area radiopaging services, the invention is also applicable for the detection of frequency modulated analogue signals and frequency modulated tones, such as are used in mobile personal radio receivers.

In an integrated circuit, the outputs of the amplifiers 11,12 will usually be available at no extra complexity in a balanced form. Hence if the multipliers 15 and 16 are balanced, this drive for balanced inputs is used. It is obvious that if the sense of the balanced drive to one multiplier is inverted, then the output of that multiplier will be of the opposite polarity and to obtain the correct overall output, block 17 must become an adder.

Figure 5:
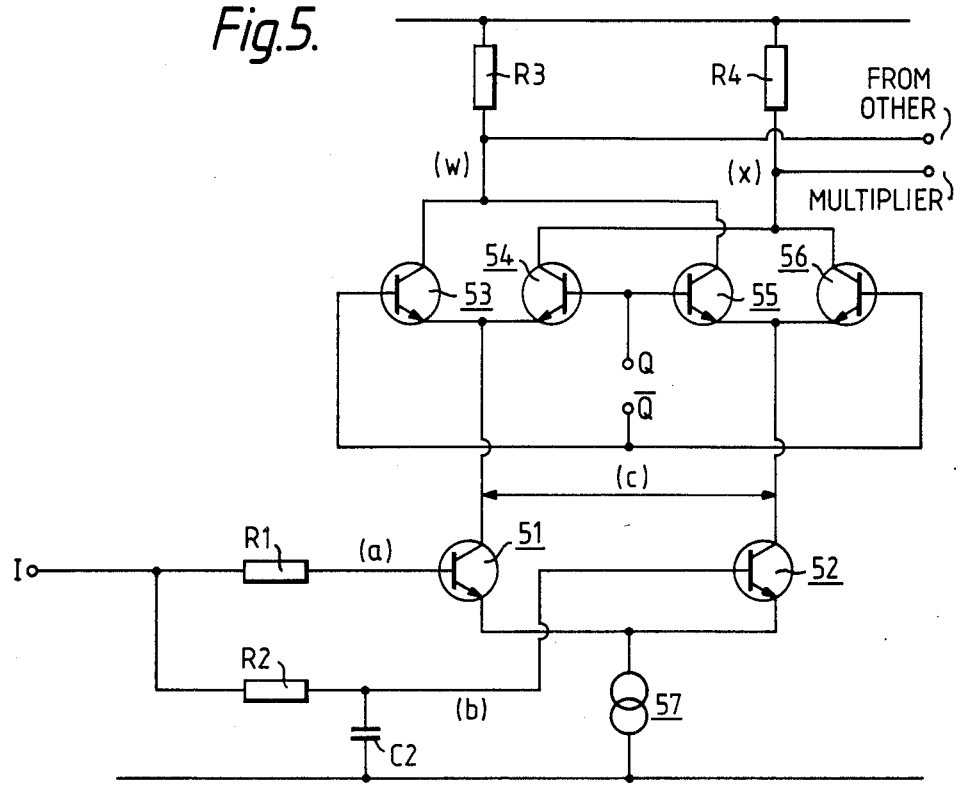
FIG. 5 is a circuit diagram of one implementation of the embodiment of FIG. 1.

A particularly convenient integrated circuit form exists for these blocks as shown in FIG. 5, in which transistors 51 to 56 form the well-known 'double balanced multiplier' circuit. This is illustrated as for multiplier 15 in FIG. 1. The I channel signal is fed to the base of transistor 51 and via an integrating network R2C2 to the base of transistor 52. These transistors provide the pulse forming network equivalent to the block 13 in FIG. 1. The Q channel signal is fed in quadrature (Q and $\overline{Q}$ are available from amplifier 12) to the bases of transistors 54,55 and 53,56 respectively, so as to switch them dependent on the values of the pulses generated by transistors 51,52. A current source 57 sets the operating current for the circuit. The differential output currents (w)(x) from the other multiplier 16 may be subtracted, as indicated in FIG. 1 (or added depending on the relative polarity of the connection), as shown in FIG. 5, and a differential output pulse train obtained by the use of resistive loads R3,R4. Resistor R1 balances the effect of R2 and is of the same value. (Resistor R1 may be omitted for some applications).

Figure 6:
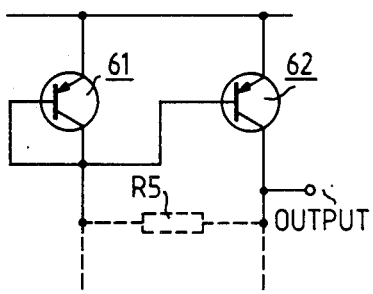
FIG. 6 illustrates a detail modification of the circuit of FIG. 5.
Figure 7:
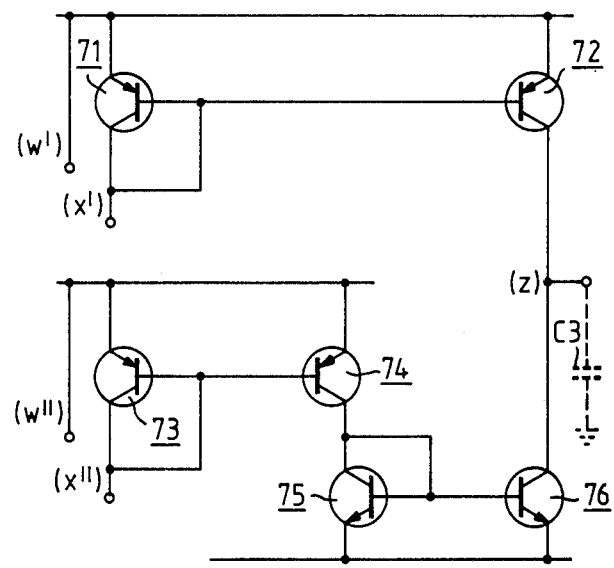
FIG. 7 illustrates an alternative configuration for part of the circuit of FIG. 5.

An alternative to the resistive loads R3,R4 is the use of a current mirror to give a single ended output, as shown in FIG. 6. Transistors 61,62 replace the resistors R3,R4 of FIG. 5. Resistor R5 is optional. In a further alternative configuration the pulse output from each multiplier is used to control a current source, as shown in FIG. 7. The output pulse current (x') of one multiplier is reflected in a current mirror, formed by transistors 71,72. The other output pulse current (w') is not affected. The output pulse current (x") of the other multiplier is reflected in two current mirrors formed by transistors 73,74 and 75,76 respectively. The outputs are then connected together. A capacitor C3, or low pass filter, connected to point z integrates the pulses. When no pulse is present from either multiplier, as the currents in both current sources are equal (or very nearly equal) no net charge flows into or out of the capacitor and hence its voltage remains constant. Each pulse either positive or negative from either multiplier charges or discharges the capacitor and the output voltage changes accordingly.

We claim:

1. A radio receiver for receiving frequency modulated signals on an R.F. carrier signal, wherein the received signals are mixed with a local oscillator signal at the carrier signal frequency to produce quadrature baseband signals in two separate signal channels, the receiver including a demodulator arrangement for the baseband signals, the demodulator arrangement including means for limiting the baseband signals in each signal channel to form square wave signals in quadrature, means in each channel to derive from the square wave signals in that channel a sequence of pulses the frequency of which is representative of the polarity changes in the square wave signal, means for multiplying the pulse sequence in each channel by the square wave signal in the other channel to produce two unipolar pulse trains, the pulse frequency in each unipolar pulse train being equal to that of the pulse sequence from which it is derived, and means for generating an output pulse signal the frequency of which is equal to the sum of the frequencies of the two unipolar pulse trains such that when the output pulse signal is low pass filtered it simulates information modulated on the R.F. signal.

2. A receiver according to claim 1 in which the pulse deriving means in each channel comprises a differential amplifier to one input of which is fed the square wave signal, and an integrating RC network via which the square wave signal is fed to the other input of the differential amplifier.

3. A receiver according to claim 2 in which the two unipolar pulse trains are produced with opposite polarities, the output pulse generating means comprising means for algebraically subtracting one unipolar pulse train from the other unipolar pulse train.

4. A receiver according to claim 3 in which the means for multiplying the pulse sequence in each channel by the square wave signal in the other channel comprises a double balanced muitiplier circuit, each multiplier circuit has an output current mirror load, the polarities of the output currents being opposite, the current mirror outputs of the two multipliers being combined and applied to a capacitor or low pass filter to form the simulated information modulation on the R.F. signal.

5. A method of demodulating frequency modulated signals on an R.F. carrier signal including the steps of mixing the modulated signals with a local oscillator signal at the carrier signal frequency to produce separate quadrature baseband signals, limiting the quadrature baseband signals to produce separate square wave signals in quadrature, deriving from each square wave signal a sequence of pulses the frequency of which is representative of the polarity changes in the square wave signal, multiplying each square wave signal by the pulse sequence derived from the other square wave signal to produce two unipolar pulse trains the pulse frequency of each being equal to that of the pulse sequence from which it is derived, and combining the two unipolar pulse trains to produce an output signal the frequency of which is equal to the sum of the frequencies of the two unipolar pulse trains.

6. An integrated semiconductor electronic circuit including a demodulator for a direct conversion radio receiver for frequency modulated signals, the demodulator comprising means for limiting the baseband signals in each signal channel to form square wave signals in quadrature, means in each channel to derive from the square wave signals in that channel a sequence of pulses the frequency of which is representative of the polarity changes in the square wave signal, means for multiplying the pulse sequence in each channel by the square wave signal in the other channel to produce two unipolar pulse trains, the pulse frequency in each unipolar pulse train being equal to that of the pulse sequence from which it is derived, and means for generating an output pulse signal the frequency of which is equal to the sum of the frequencies of the two unipolar pulse trains.

* * * * *